United States Patent
Lee et al.

(10) Patent No.: US 6,787,434 B1
(45) Date of Patent: Sep. 7, 2004

(54) METHOD OF FABRICATING POLYSILICON FILM BY NICKEL/COPPER INDUCED LATERAL CRYSTALLIZATION

(75) Inventors: Si-Chen Lee, Taipei (TW); Wei-Chieh Hsuch, Taipei (TW); Chi-Chieh Chen, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 10/428,132

(22) Filed: May 2, 2003

(30) Foreign Application Priority Data

Apr. 1, 2003  (TW) ........................................ 92107445 A

(51) Int. Cl.[7] ........................ H01L 21/00; H01L 21/331; H01L 21/44; H01L 21/20; H01L 21/425
(52) U.S. Cl. ...................... 438/487; 438/150; 438/311; 438/687; 438/674; 438/676; 438/679; 438/684; 438/686; 438/482; 438/486; 438/488; 438/506; 438/517
(58) Field of Search ................................ 438/150, 311, 438/687, 674, 676, 679, 684, 686, 482, 486, 487, 488, 506, 517

(56) References Cited

U.S. PATENT DOCUMENTS

| | | | |
|---|---|---|---|
| 5,427,053 A | * 6/1995 | Tsuno et al. ................ 117/88 |
| 6,221,702 B1 | 4/2001 | Joo ............................. 438/166 |
| 6,277,714 B1 | * 8/2001 | Fonash et al. .............. 438/486 |
| 6,489,222 B2 | * 12/2002 | Yoshimoto .................. 438/486 |
| 6,531,348 B2 | * 3/2003 | Kim et al. ................... 438/166 |
| 6,541,323 B2 | 4/2003 | Yang .......................... 438/200 |
| 6,548,331 B2 | * 4/2003 | Lee et al. ................... 438/149 |
| 6,727,121 B2 | * 4/2004 | Joo et al. .................... 438/149 |
| 2002/0137310 A1 | * 9/2002 | Joo et al. .................... 438/487 |
| 2003/0022492 A1 | * 1/2003 | Akiyoshi .................... 438/678 |

* cited by examiner

Primary Examiner—John F. Niebling
Assistant Examiner—Stanetta Isaac
(74) Attorney, Agent, or Firm—Troxell Law Office PLLC

(57) ABSTRACT

The present invention relates to a method of fabricating polysilicon film by Nickel and Copper induced lateral crystallization for the TFT-LCD, comprising the step of: a) a thin (~4 nm) Copper and Nickel being evaporated onto the substrate; b) a amorphous-silicon film (~50 nm) being evaporated onto thereof obtained according to a); c) applying annealing at less than 600° C. to thereof obtained according to b) for fast fabricating poly-silicon film. It is approximately 10 times faster than that of Ni induced polysilicon. The present invention is to provide a low-temperature (<600° C.) fast growth rate process to convert the hydrogenated amorphous silicon (a-Si:H) films to poly-silicon film for substantially time-saving process and industrial applicability.

8 Claims, 9 Drawing Sheets

METHOD OF FABRICATING POLYSILICON FILM BY NICKEL/COPPER INDUCED LATERAL CRYSTALLIZATION

REFERENCE CITED

1. U.S. Pat. No. 6,221,702.
2. U.S. Pat. No. 6,541,323.

BACKGROUND OF THE INVENTION

1. Field of the Invention

The present invention relates to a method of fabricating polysilicon film by Nickel (Ni) and Copper (Cu) induced lateral crystallization, particularly to process under low-temperature annealing condition being about 10 times faster than that induced by Ni alone while keeping the similar grain size. Therefore, this invention substantially reduces the processing time, thereby increasing the industrial applicability adopting the method.

2. Discussion of the Related Art

At present the hydrogenated armophous silicon (a-Si:H) thin film was applied to various areas, i.e., the solar battery in calculators; the thin film transistor (TFT) as a switching element in a active matrix liquid crystal display (AMLCD). AMLCDs have been used in notebook computer and digital camera and gradually replaced the conventional cathode ray tube (CRT) in monitors and desktop computers. However, the field effect mobility of a-Si:H is low, i.e., ~0.5 $cm^2$/V-sec, which limits its performance. A polysilicon TFT is able to provide higher field effect mobility, i.e., >50$cm^2$/V-sec, and reduce the response time of display than that of an amorphous silicon TFT. Traditionally, there are three ways to grow low temperature polysilicon thin film.

(a) direct growth of polysilicon thin film by high-temperature heat treatment,
  (b) conversion of an amorphous silicon (a-Si:H) thin film to polysilicon by Ni induced crystallization,
  (c) conversion of an amorphous silicon (a-Si:H) thin film to polysilicon by excimer laser annealing.

In (a), a polysilicon thin film can be grown by low pressure chemical vapor deposition (LPCVD) at a temperature above 600° C. Since the glass substrate of LCD becomes soft at temperature higher than 600° C., an expensive quartz substrate must be used, thereby increasing the fabrication cost.

In (b), the amorphous silicon (a-Si:H) film was first deposited on glass substrate by plasma enhanced chemical vapor deposition (PECVD) or LPCVD. Ni is deposited either on or under the amorphous silicon (a-Si:H) film. Then that was annealed at a temperature below 600° C. to crystallize a-Si:H. When that was annealed at 550° C. for 20 h, the range of crystallization is about 30 μm from the edge of Ni bars and the growth rate of polysilicon is 1.5 μm per hour. If the annealing time is shorter, the growth rate increases to about 2 μm per hour, This method requires a long processing time, causes difficulties in mass production. The use of Cu improves the growth rate of polysilicon, i.e., approximately 4 to 10 times larger than that of Ni induced polysilicon, but the grain size is 10 times smaller, it is difficult to achieve high field effect mobility and reduce the response time of LCD.

In (c), the amorphous silicon (a-Si:H) film was first deposited on glass substrate by PECVD or LPCVD. then excimer laser was used to anneal the a-Si:H film to form polysilicon crystallization. Although the process time decreases but the grain size is smaller, the electrical characteristic of the TFT is worse than that of Ni induced polysilicon.

SUMMARY OF THE INVENTION

Accordingly, the present invention is directed to a method of fabricating polysilicon film that substantially obviates one or more of the problems due to limitations and disadvantages of the related art.

The main object of present invention is to provide a method of fabricating polysilicon film which improves the growth rate of polysilicon thin film by mean of applying low-temperature annealing to hydrogenated amorphous silicon (a-Si:H) thin film.

Another object of the present invention is to provide a fabrication method for a polysilicon film having reliable electrical characteristics.

To achieve these and other advantages and in accordance with the purpose of the present invention, as embodied and broadly described, the present invention includes the steps:

a) evaporating a 1-nm to 50-nm-thick Copper (Cu) on substrate;
b) evaporating a 1-nm to 50-nm-thick Nickel (Ni) on said Copper (Cu);
c) forming a 1-nm to 200-nm-thick amorphous silicon thin film on thereof obtained according to b) including the Copper (Cu) and Nickel (Ni): and
d) forming a polysilicon thin film on thereof obtained according to c) by below 600° C. annealing.

Also, the present invention includes a fabrication method for polysilicon film comprising the faster growth rate of polysilicon thin film under below 600° C. annealing condition, i.e., this invention substantially reduces the processing time, thereby increasing the industrial applicability adopting said method.

It is to be understood that both the foregoing general description and the following detailed description are exemplary and explanatory and are intended to provide further explanation of the invention as claimed.

BRIEF DESCRIPTION OF THE DRAWINGS

The present invention will be better understood from the following detailed description of preferred embodiments of the invention, taken in conjunction with the accompanying flow diagram, in which.

DETAILED DESCRIPTION OF THE PREFERRED EMBODIMENT

The following descriptions of the preferred embodiments are provided to understand the features and the structures of the present invention.

Figure 1:
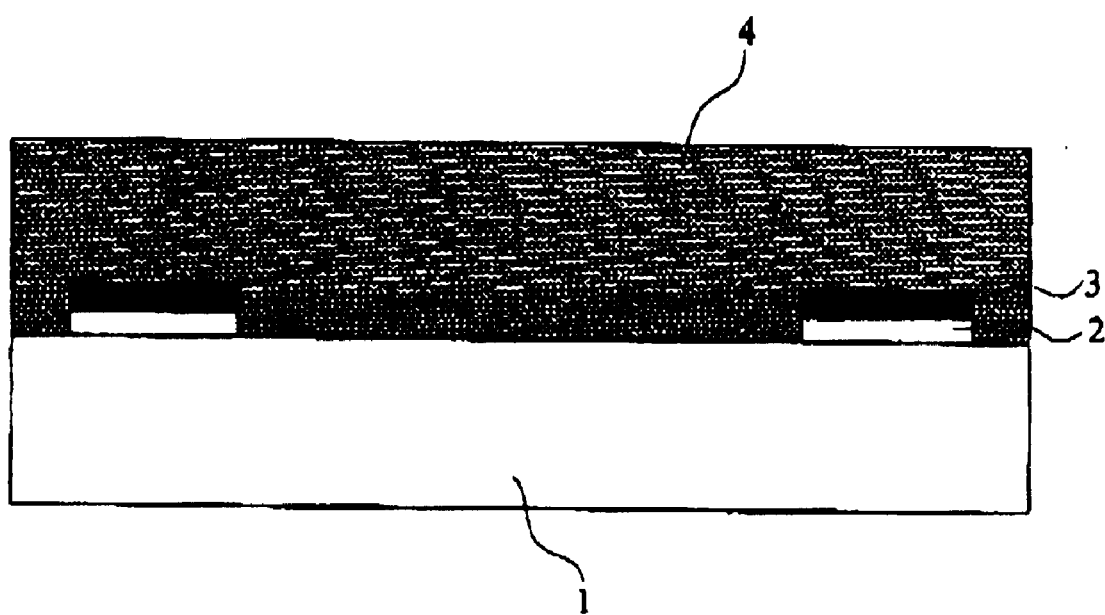
FIG. 1 is a diagram showing Nickel and Copper (Ni/Cu) induced lateral crystallization of polysilicon thin film before thermal annealing according to the present invention.
Figure 2:
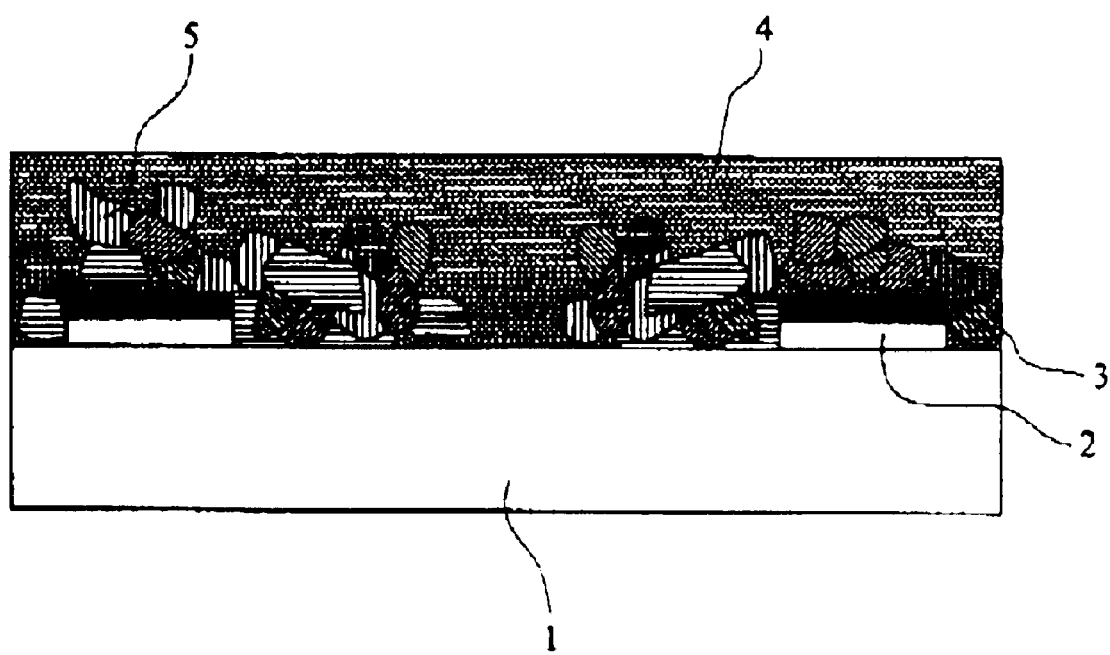
FIG. 2 is a diagram showing Ni/Cu induced lateral crystallization of polysilicon thin film after thermal annealing according to the present invention.
Figure 3:
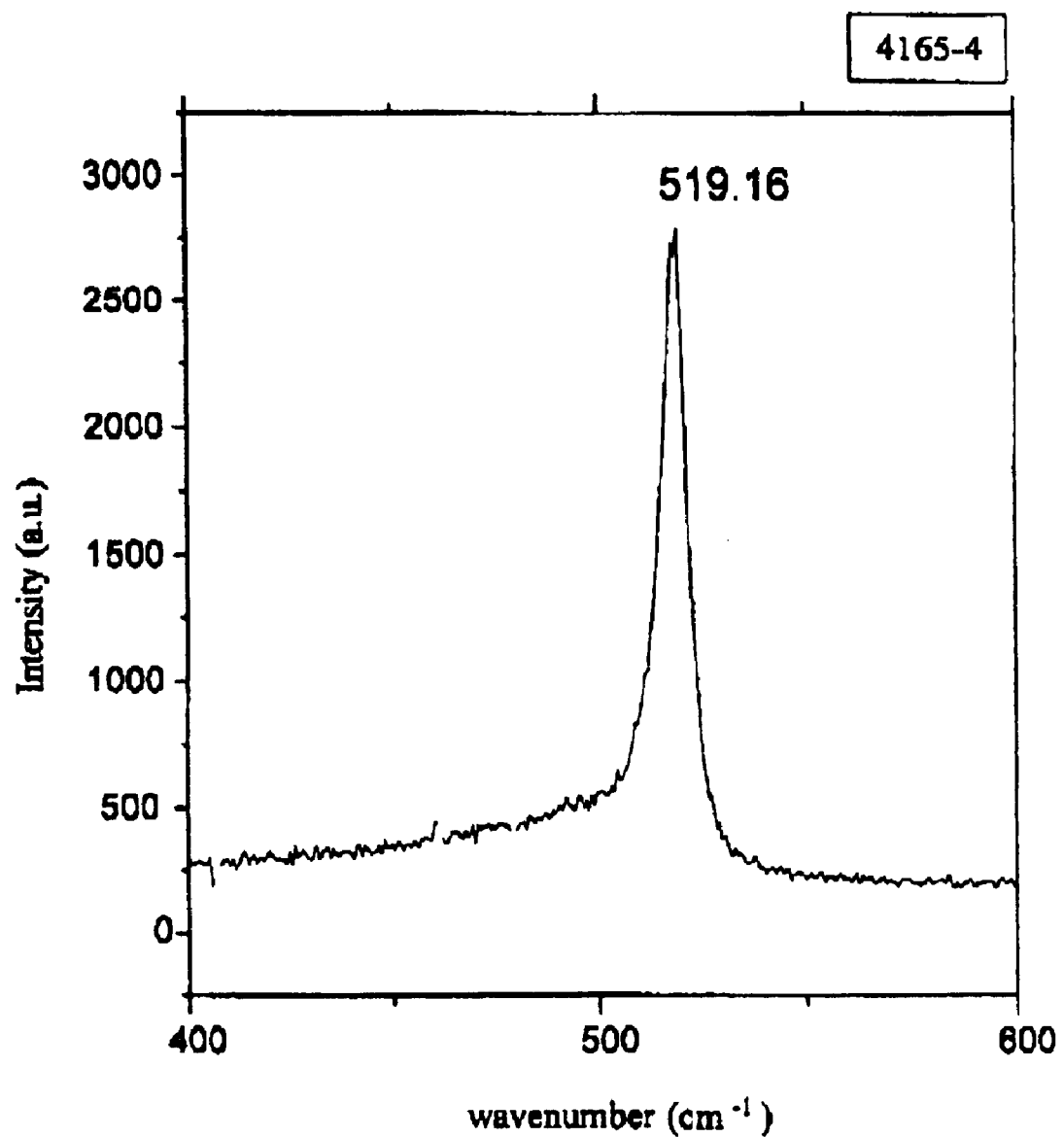
FIG. 3 is a diagram showing the Raman spectrum of annealed polysilicon film.
Figure 4:
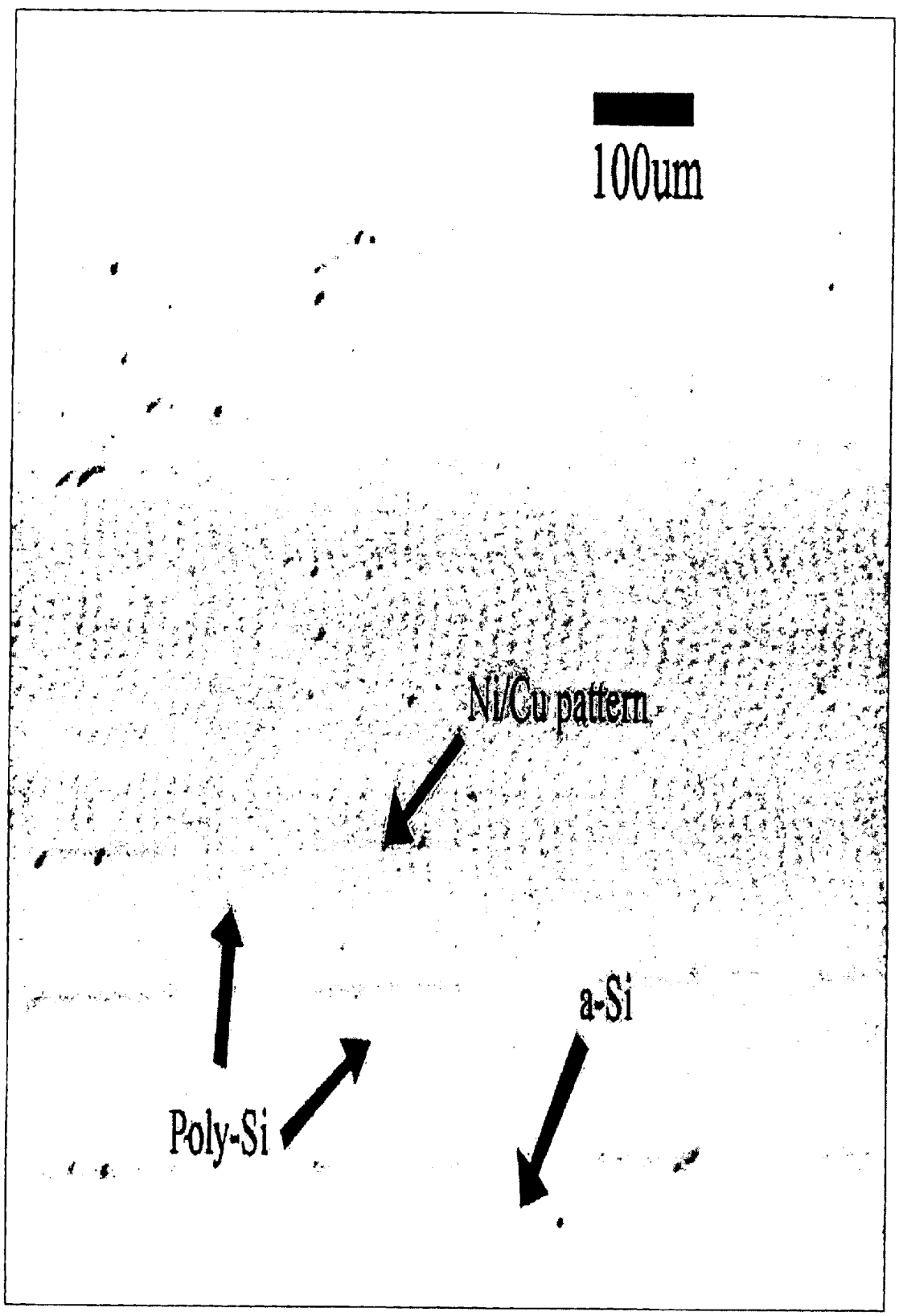
FIG. 4(A) is a diagram showing optical micrograph of Ni/Cu induced lateral crystallization of polysilicon thin film after annealing at 550° C. for 2 h according to the present invention.
FIG. 4(B) is a diagram showing optical micrograph of Ni/Cu induced lateral crystallization of polysilicon thin film after annealing at 550° C. for 4 h according to the present invention.
FIG. 4(C) is a diagram showing optical micrograph of Ni/Cu induced lateral crystallization of polysilicon thin film after annealing at 550° C. for 6 h according to the present invention.
Figure 4:
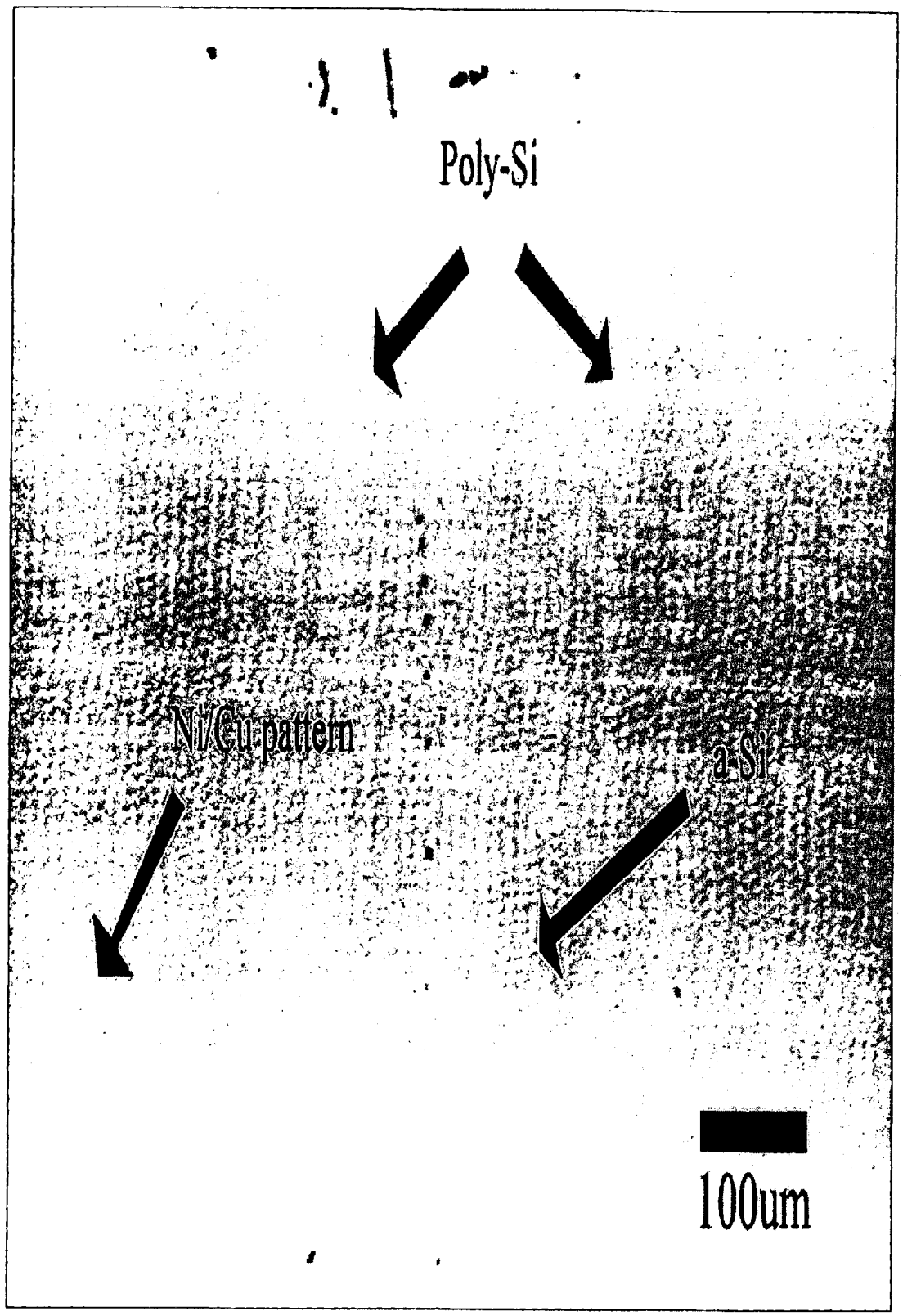
Figure 4:
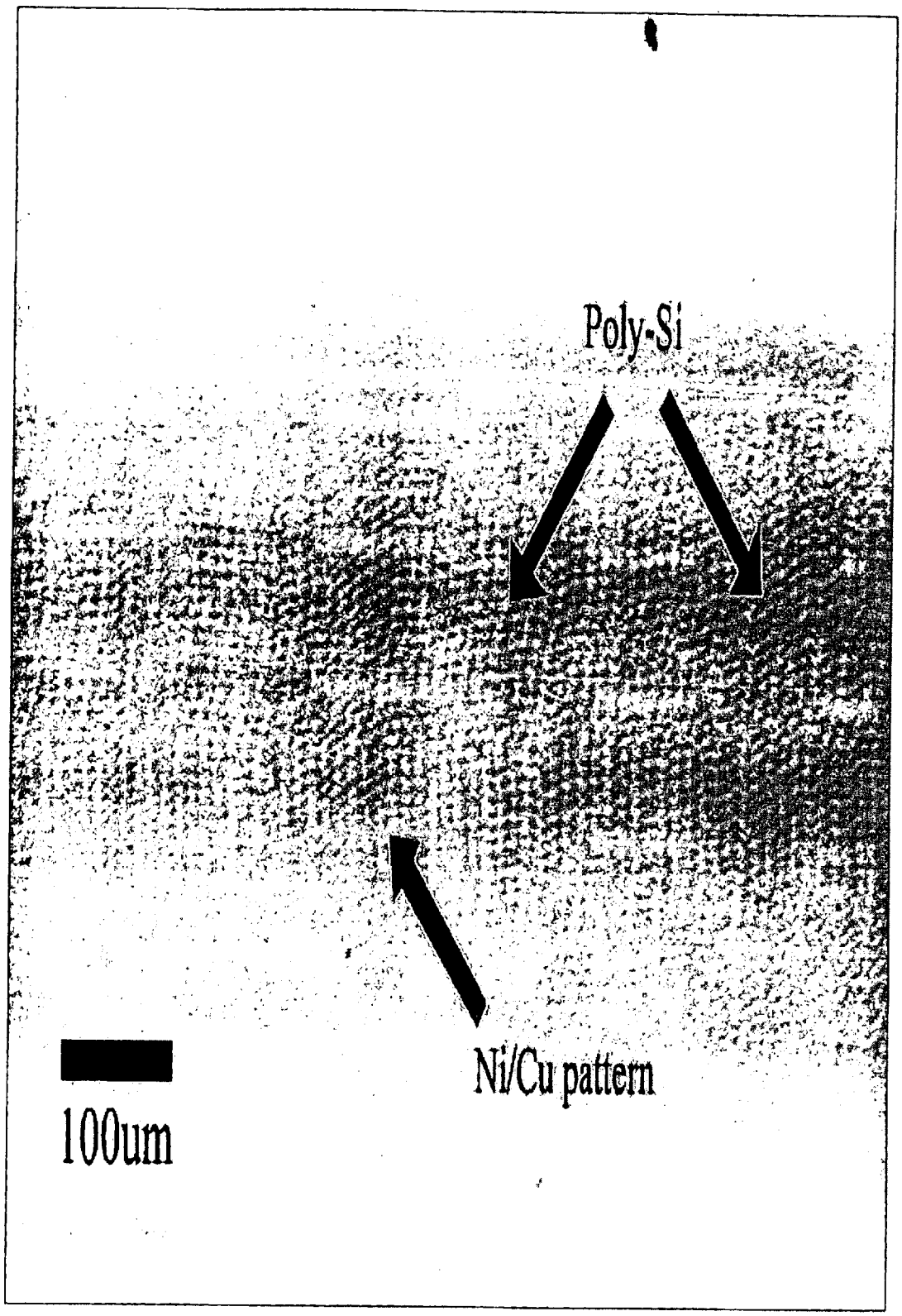
Figure 5:
FIG. 5(A) is a diagram showing the bright field image of transmission electron microscopy (TEM) of Ni/Cu induced lateral crystallization of polysilicon according to the present invention.
FIG. 5(B) is a diagram showing the TEM dark field image of Ni/Cu induced lateral crystallization of polysilicon according to the present invention.
FIG. 5(C) is a diagram showing transmission electron diffraction (TED) pattern of Ni/Cu induced lateral crystallization of polysilicon according to the present invention.
Figure 5:
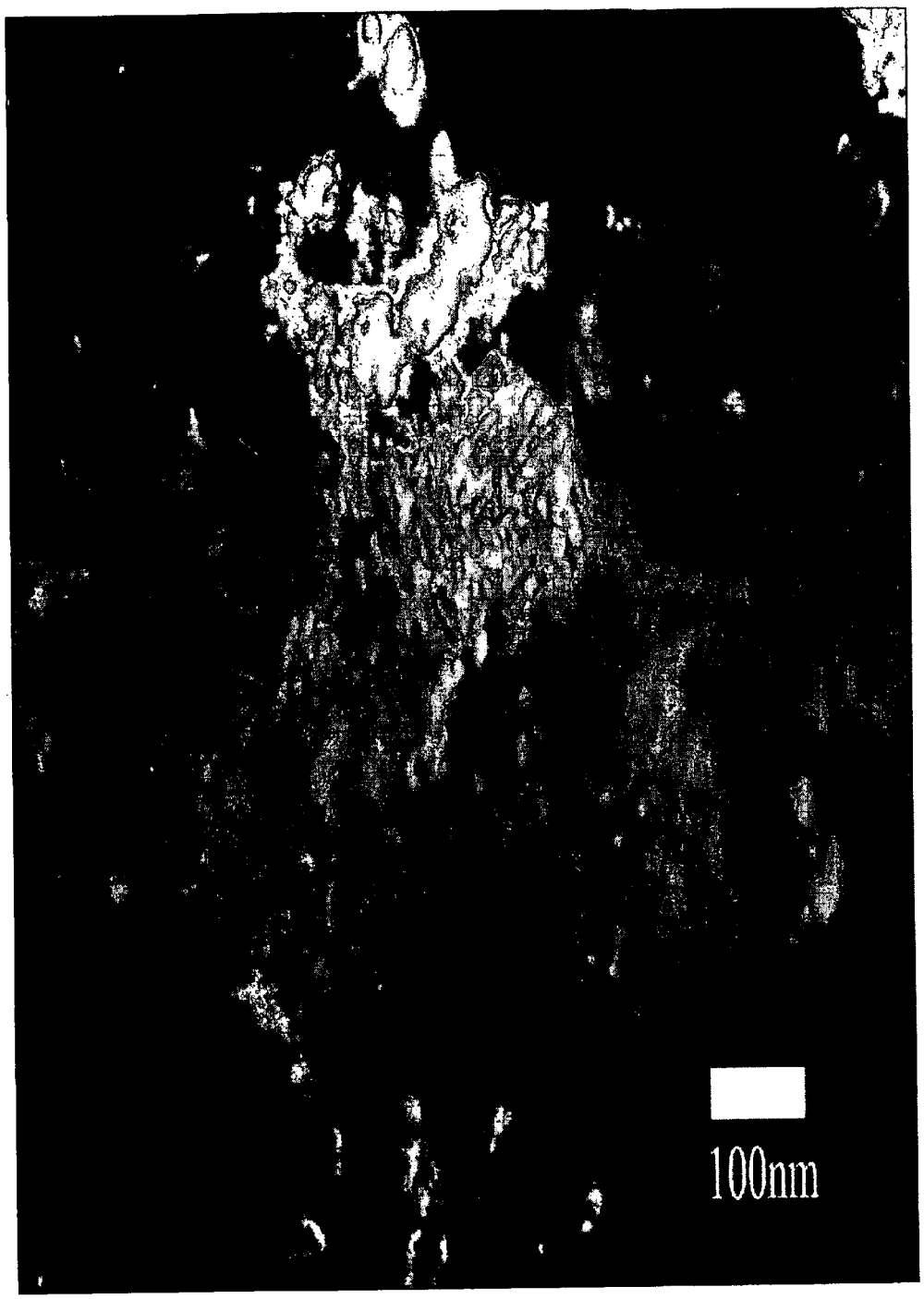
Figure 5:
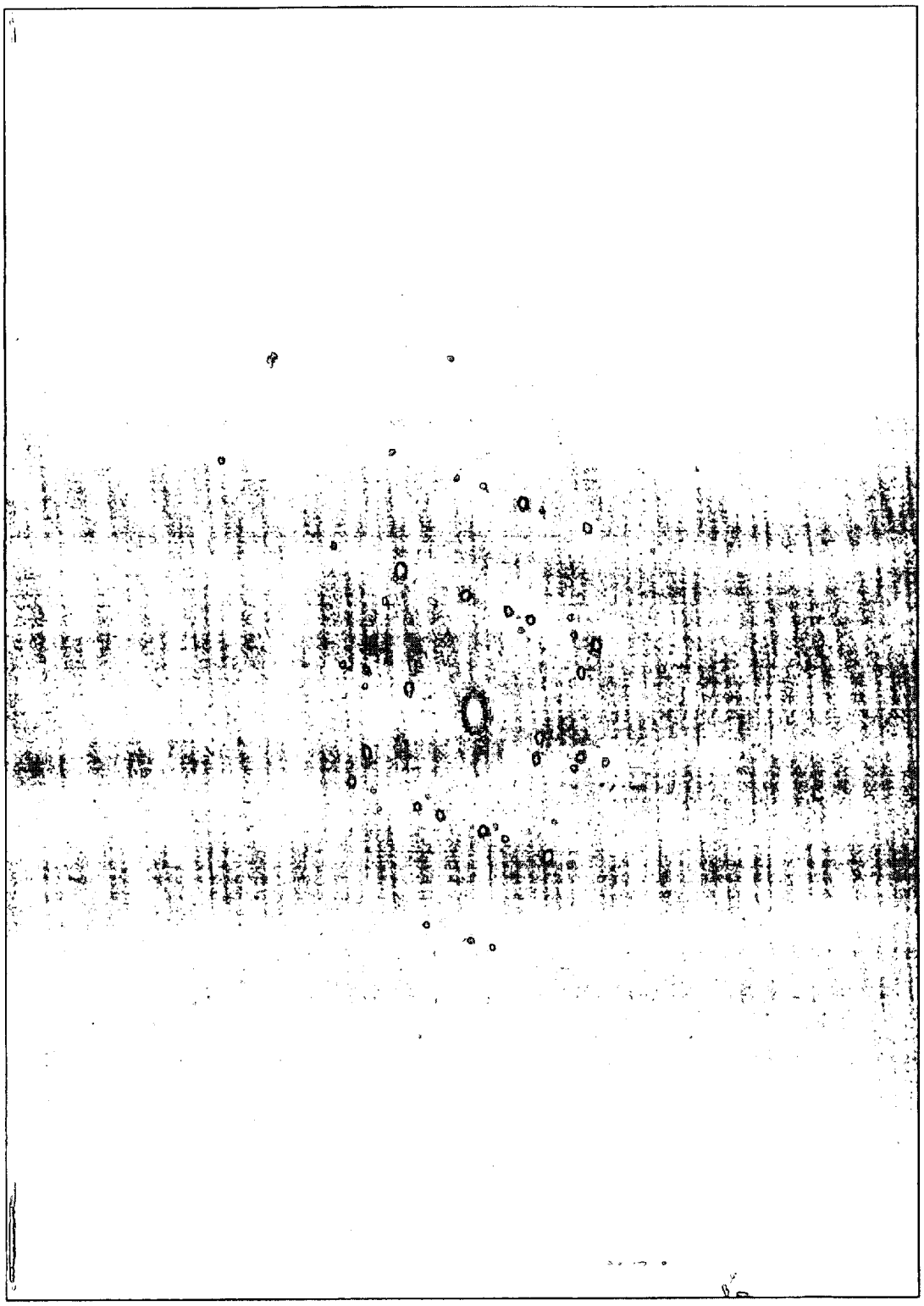

FIG. 1 illustrates a diagram showing Ni/Cu induced lateral crystallization of polysilicon thin film before thermal annealing. FIG. 2 illustrates a diagram showing Ni/Cu induced lateral crystallization of polysilicon thin film after thermal annealing. FIG. 3 illustrates the Raman spectrum of annealed polysilicon film. FIG. 4(A) illustrates a diagram showing optical micrograph of Ni/Cu induced lateral crystallization of polysilicon thin film after annealing at 550° C. for 2 h. FIG. 4(B) illustrates a diagram showing optical micrograph of Ni/Cu induced lateral crystallization of polysilicon thin film after annealing at 550° C. for 4 h. FIG. 4(C) illustrates a diagram showing optical micrograph of Ni/Cu induced lateral crystallization of polysilicon thin film after annealing at 550° C. for 6 h. FIG. 5(A) illustrates a diagram showing TEM bright field image of Ni/Cu induced lateral crystallization of polysilicon. FIG. 5(B) illustrates a diagram showing TEM dark field image of Ni/Cu induced lateral crystallization of polysilicon. FIG. 5(C) illustrates a diagram showing transmission electron diffraction of Ni/Cu induced lateral crystallization of polysilicon. From FIG. 1 to FIG. 5 the present invention provides a method of fabricating polysilicon thin film by Ni/Cu induced lateral crystallization which can be used to fabricate the thin film transistor (TFT) in liquid crystal display (LCD). Furthermore, because Cu, Ni and amorphous silicon form the silicide, the latent heat released together with the migration of nickel silicide crystallize amorphous silicon to polysilicon. Therefore, if the amorphous silicon thin film 4 is deposited on top of Cu 2 and Ni 3, the polysilicon 5 can be formed by annealing at a temperature below 600° C. In addition, the process time substantially reduces, thereby increasing the industrial applicability adopting said method that is proposed to the following step:

a) evaporate a 1-nm to 50-nm-thick Cu 2 on substrate. The substrate is selected from the group consisting of grass, insulating material and semiconductor. The Cu 2 is selected from the group consisting of Copper-Nickel alloy, and multiple-element alloy including Copper and Nickel.

b) Evaporate a 1-nm to 50-nm-thick Ni 3 on said Cu 2. The Ni 3 is selected from the group consisting of Copper-Nickel alloy, and multiple-element alloy including Copper and Nickel. The method can change from a) and b) to b) and a) In order;

c) Form a 1-nm to 200-nm-thick amorphous silicon thin film 4 on thereof obtained according to b) including the Cu 2 and Ni 3. It further comprising amorphous silicon thin film 4 being doped with Cu 2 and Ni 3 by ion-implantation and it further comprising to form amorphous silicon thin film 4 by chemical vapor deposition (CVD). CVD is plasma enhanced chemical vapor deposition (PECVD) or low pressure chemical vapor deposition (LPCVD).

d) Form a polysilicon thin film 5 on thereof obtained according to c) being processed under annealing temperature below 600° C.

Referring to FIG. 1, the Cu 2 and Ni 3 evaporated on the substrate. Then, the amorphous silicon thin film 4 is formed by a evaporation or deposition. After the amorphous silicon thin film 4 is formed thereon, that was prepared with processes under annealing below 600° C. for forming a polysilicon thin film 5. The annealing temperature high enough for fast growth rate of polysilicon thin film 5 is reached. After the annealing is finished, a polysilicon thin film 5 implements a fabricating polysilicon film in the FIG. 2.

FIG. 3 shows the diagram of Cu 2 and Ni 3 induced lateral crystallization of polysilicon thin film 5 adopting the Raman spectrum according to the present invention in which the thickness of amorphous silicon thin film 4 is 65 nm, the thickness of Cu 2 is 4 nm, the thickness of Ni 3 above Cu 2 is 4 nm, the annealing temperating is 550° C., and annealing time is 10 h. It is clear from the FIG. 3 that the Raman specturm display peak position at 519.16 cm$^{-1}$. In other words, the Cu 2 and Ni 3 can induce polysilicon thin film 5 having high quality crystallinity in said method.

FIG. 4 shows the optical microscope picture of Cu 2 and Ni 3 induced lateral crystallization of polysilicon thin film 5 in which the thickness of amorphous silicon thin film 4 is 65 nm, the thickness of Cu 2 is 4 nm, the thickness of Ni 3 is 4 nm. Because the refractive indexes of amorphous silicon and polysilicon are different, they can be distinguished under the optical microscope. The growth rate of polysilicon thin film 5 is easily calculated from the picture. FIG. 4(A) is a diagram showing optical micrograph of Cu 2 and Ni 3 induced lateral crystallization of polysilicon thin film 5 after annealing at 550° C. for 2 h according to the present invention in which the growth rate of polysilicon thin film 5 is about 22 $\mu$m per hour. FIG. 4(B) is a diagram showing optical micrograph of Cu 2 and Ni 3 induced lateral crystallization of polysilicon thin film 5 after annealing at 550° C. for 4 h according to the present invention in which the growth rate of polysilicon thin film 5 is about 25 $\mu$m per hour. FIG. 4(C) is a diagram showing optical micrograph of Cu 2 and Ni 3 induced lateral crystallization of polysilicon thin film 5 after annealing at 550° C for 6 h according to the present invention in which the growth rate of polysilicon thin film 5 is about 25 $\mu$m to 30 $\mu$m per hour.

FIG. 5 shows the TEM image of Cu 2 and Ni 3 induced lateral crystallization of polysilicon thin film 5 in which the thickness of amorphous silicon thin film 4 is 65 nm, the thickness of Cu 2 is 4 nm, the thickness of Ni 3 is 4 nm, the annealing temperating is 550° C. and annealing time is 10 h. FIG. 5(A) is a diagram showing TEM bright field image. FIG. 5(B) is a diagram showing TEM dark field image. FIG. 5 (C) is a diagram showing transmission electron diffraction (TED) pattern of polysilicon thin film 5. Referring to FIG.5 (A) and FIG. 5(C), the average grain size of Cu 2 and Ni 3 induced lateral crystallization of polysilicon thin film 5 is about 0.35 $\mu$m.

The characteristics of present invention are proposed as follow:

(1). the method is used to crystallize a large-area amorphous silicon to polysilicon thin film 5 without scanning.

(2). The substrate for Cu 2 and Ni 3 induced lateral crystallization of polysilicon thin film 5 is selected from the group consisting of glass, insulating material and semiconductor.

(3). The area of polysilicon thin film 5 close to the Cu 2 and Ni 3 bars is suitable for a wide scope of applications.

To sum up the above mentioned, the present invention is inventive, innovative and progressive. The patent for this present invention is hereby applied for. It should include all variations and versions covered by the present invention, including possible minor improvements and more exact definitions.

The above mentioned practical examples are used to describe the invention in more detail, they should therefore be included in the range of the invention, but should not restrict the invention in any way.

What is claimed is:

1. A method of fabricating polysilicon film by Nickel/Copper induced lateral crystallization, the method comprising:
   a) evaporating a 1-nm to 50-nm-thick Copper (Cu) on substrate;
   b) evaporating a 1-nm to 50-nm-thick Nickel (Ni) on said Copper;
   c) forming a 1-nm to 200-nm-thick amorphous silicon thin film on thereof obtained according to b) including the Copper (Cu) and Nickel (Ni); and
   d) forming a polysilicon thin film on thereof obtained according to c) being processed by annealing at a temperature below 600° C.

2. A method according to claim 1, wherein said substrate is selected from the group consisting of glass, insulating material and semiconductor.

3. A method according to claim 1, wherein the method can change from a) and b) to b) and a) in order.

4. A method according to claim 1, wherein said copper (Cu) is selected from the group consisting of Copper-Nickel alloy, and multiple-element alloy including Copper and Nickel.

5. A method according to claim 1, wherein said Nickel (Ni) is selected from the group consisting of Copper-Nickel alloy, and multiple-element alloy including Copper and Nickel.

6. A method according to claim 1, further comprising amorphous silicon thin film being doped with Copper (Cu) and Nickel (Ni) by ion-implantation.

7. A method according to claim 1, further comprising the step of c) to form amorphous silicon thin film by chemical vapor deposition (CVD).

8. A method according to claim 7, wherein said chemical vapor deposition (CVD) is plasma enhanced chemical vapor deposition (PECVD) or low pressure chemical vapor deposition (LPCVD).

* * * * *